(12) United States Patent
Kijima et al.

(10) Patent No.: US 7,037,731 B2
(45) Date of Patent: May 2, 2006

(54) FERROELECTRIC CAPACITOR, METHOD OF MANUFACTURING THE SAME, FERROELECTRIC MEMORY, AND PIEZOELECTRIC DEVICE

(75) Inventors: Takeshi Kijima, Matsumoto (JP); Koji Ohashi, Chino (JP); Eiji Natori, Chino (JP)

(73) Assignee: Seiko Epson Corporation, Tokyo (JP)

( * ) Notice: Subject to any disclaimer, the term of this patent is extended or adjusted under 35 U.S.C. 154(b) by 100 days.

(21) Appl. No.: 10/807,278

(22) Filed: Mar. 24, 2004

(65) Prior Publication Data
US 2004/0229384 A1    Nov. 18, 2004

(30) Foreign Application Priority Data
Mar. 26, 2003   (JP) ............................. 2003-085791
Aug. 27, 2003   (JP) ............................. 2003-302901

(51) Int. Cl.
*H01L 21/00*    (2006.01)
(52) U.S. Cl. ...................................................... 438/3

(58) Field of Classification Search .................... 438/3
See application file for complete search history.

(56) References Cited

U.S. PATENT DOCUMENTS

| 6,566,261 B1 * | 5/2003 | Ikegami et al. ............. 438/687 |
| 6,635,497 B1 * | 10/2003 | Aggarwal et al. ............. 438/3 |
| 2004/0214352 A1 | 10/2004 | Kijima et al. .................. 438/3 |

* cited by examiner

*Primary Examiner*—Christian D. Wilson
(74) *Attorney, Agent, or Firm*—Oliff & Berridge PLC

(57) ABSTRACT

A method of manufacturing a ferroelectric capacitor. In this method, a lower electrode is formed on a base at first. A ferroelectric film which includes a PZTN complex oxide including lead, zirconium, titanium, and niobium on the lower electrode is formed, and then an upper electrode is formed on the ferroelectric film. A protective film is then formed to cover the lower electrode, the ferroelectric film, and the upper electrode, and heat treatment for crystallizing the PZTN complex oxide is performed at least after forming the protective film.

4 Claims, 9 Drawing Sheets

US 7,037,731 B2

FERROELECTRIC CAPACITOR, METHOD OF MANUFACTURING THE SAME, FERROELECTRIC MEMORY, AND PIEZOELECTRIC DEVICE

Japanese Patent Application No. 2003-85791, filed on Mar. 26, 2003, and Japanese Patent Application No. 2003-302901, filed on Aug. 27, 2003, are hereby incorporated by reference in their entirety.

BACKGROUND OF THE INVENTION

The present invention relates to a ferroelectric capacitor, a method of manufacturing the ferroelectric capacitor, a ferroelectric memory, and a piezoelectric device.

A ferroelectric memory (FeRAM) retains data by spontaneous polarization of a ferroelectric capacitor using a ferroelectric film. In the ferroelectric memory, the crystallization state of the ferroelectric film included in the ferroelectric capacitor is one of the factors which determine the characteristics of the device. The manufacturing steps of the ferroelectric memory include a step of forming an interlayer dielectric and a protective film, in which a process which generates a large amount of hydrogen is used. Since the ferroelectric film is substantially formed of an oxide, the oxide may be reduced by hydrogen generated during the manufacturing steps and adversely affect the characteristics of the ferroelectric capacitor.

Therefore, in a conventional ferroelectric memory, the ferroelectric capacitor is covered with a barrier film such as an aluminum oxide film or an aluminum nitride film in order to prevent deterioration of the characteristics of the ferroelectric capacitor, thereby securing reduction resistance of the capacitor. However, such a barrier film occupies a surplus region when increasing the degree of integration of the ferroelectric memory. Moreover, a technology capable of manufacturing a ferroelectric memory using a simplified process is demanded from the viewpoint of productivity.

BRIEF SUMMARY OF THE INVENTION

The present invention may provide a ferroelectric capacitor capable of securing sufficient characteristics using a simplified process without forming a barrier film, a method of manufacturing the ferroelectric capacitor, and a ferroelectric memory and a piezoelectric device using the ferroelectric capacitor.

According to one aspect of the present invention, there is provided a method of manufacturing a ferroelectric capacitor, comprising:

forming a lower electrode on a base;

forming a ferroelectric film which includes a lead zirconate titanate niobate (PZTN) complex oxide including lead, zirconium, titanium, and niobium on the lower electrode;

forming an upper electrode on the ferroelectric film;

forming a protective film so as to cover the lower electrode, the ferroelectric film, and the upper electrode; and performing heat treatment for crystallizing the PZTN complex oxide at least after forming the protective film.

Figure 1A:
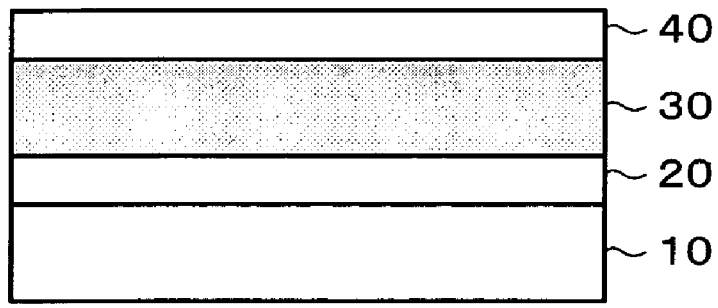
FIGS. 1A to 1C are cross-sectional views showing manufacturing steps of a ferroelectric capacitor according to an embodiment of the present invention.

DETAILED DESCRIPTION OF THE EMBODIMENT (1) According to one embodiment of the present invention, there is provided a method of manufacturing a ferroelectric capacitor, comprising:

forming a lower electrode on a base;

forming a ferroelectric film which includes a lead zirconate titanate niobate (PZTN) complex oxide including lead (Pb), zirconium (Zr), titanium (Ti), and niobium (Nb) on the lower electrode;

forming an upper electrode on the ferroelectric film;

forming a protective film so as to cover the lower electrode, the ferroelectric film, and the upper electrode; and performing heat treatment for crystallizing the PZTN complex oxide at least after forming the protective film.

According to this method of manufacturing a ferroelectric capacitor, the PZTN complex oxide including Pb, Zr, Ti, and Nb is used as a material for the ferroelectric film, and the PZTN complex oxide is crystallized after forming the protective film. Therefore, even if the ferroelectric film is damaged by hydrogen generated when forming the protective film, the PZTN complex oxide is crystallized while recovering from the damage by performing the heat treatment for crystallization after forming the protective film. Therefore, the formation process of a barrier film for protecting the ferroelectric film from a reduction reaction can be omitted, whereby an increase in productivity and a reduction of manufacturing cost can be achieved.

This method of manufacturing a ferroelectric capacitor may include any of the following features.

(2) The PZTN complex oxide may be in an amorphous state after pre-heat treatment in an oxidizing atmosphere and before the heat treatment in the step of forming the ferroelectric film.

According to this feature, the PZTN complex oxide is in an amorphous state before the crystallization. In a ferroelectric film formed by using such PZTN complex oxide, deterioration of crystal quality due to grain boundary diffusion can be reduced. Since the PZTN complex oxide in an amorphous state has been subjected to the pre-heat treatment in an oxidizing atmosphere, oxygen is introduced into the film. Therefore, the PZTN complex oxide can be crystallized during the heat treatment independent of the type of gas included in the atmosphere.

(3) The protective film may be a silicon oxide film and is formed by using trimethylsilane.

According to this feature, since the protective film is formed of a silicon oxide film using trimethylsilane (TMS), which generates a smaller amount of hydrogen than tetraethylorthosilicate (TEOS) which is generally used to form a silicon oxide film, damage to the ferroelectric film due to a reduction reaction can be reduced.

(4) The heat treatment for crystallizing the PZTN complex oxide may be performed in a non-oxidizing atmosphere.

According to this feature, if peripheral members other than the capacitor (metal interconnects, for example) are included in the device during the process, oxidation damage to the peripheral members due to the high-temperature heat treatment can be reduced because the heat treatment for crystallization is performed in a non-oxidizing atmosphere.

(5) A ferroelectric capacitor according to one embodiment of the present invention is formed by the above-described method of manufacturing a ferroelectric capacitor.

(6) A ferroelectric memory according to one embodiment of the present invention comprises the above ferroelectric capacitor.

(7) A piezoelectric device according to one embodiment of the present invention comprises the above ferroelectric capacitor.

The embodiments of the present invention will be described below in more detail with reference to the drawings.

1. Ferroelectric Capacitor

Figure 1B:
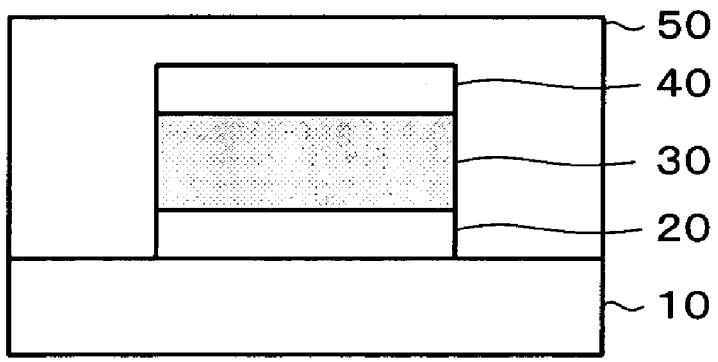
Figure 1C:
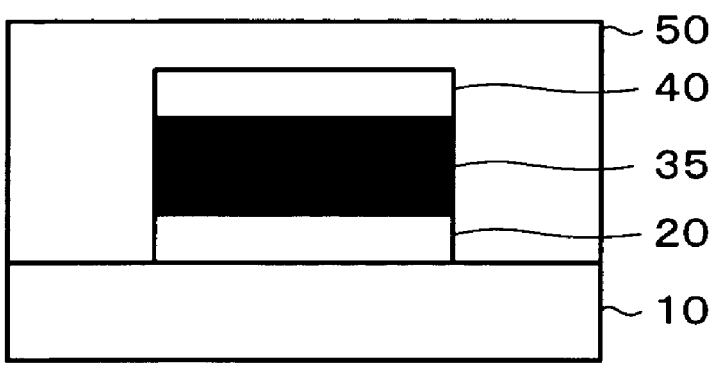

FIGS. 1A to 1C are cross-sectional views schematically showing manufacturing steps of a ferroelectric capacitor according to an embodiment of the present invention.

(1) As shown in FIG. 1A, a lower electrode 20, a ferroelectric film 30, and an upper electrode 40 are stacked on a given substrate 10 in that order.

As the substrate 10, a substrate such as a semiconductor substrate or a resin substrate may be arbitrarily employed depending on the application of the ferroelectric capacitor. The substrate 10 is not particularly limited.

The lower electrode 20 and the upper electrode 40 may be formed of a noble metal element such as Pt, Ir, or Ru, or a composite material containing the noble metal as an essential component, for example. The lower electrode 20 and the upper electrode 40 may be formed by using a conventional deposition method such as a sputtering method or a vapor deposition method. If the elements of the ferroelectric diffuses into the lower electrode 20 and the upper electrode 40, composition variation occurs at the interface between the electrode and the ferroelectric film 30, whereby squareness of the hysteresis decreases. Therefore, it is desirable that the lower electrode 20 and the upper electrode 40 have a density which does not allow the elements of the ferroelectric to diffuse into the lower electrode 20 and the upper electrode 40. In order to increase the density of the lower electrode 20 and the upper electrode 40, a method of depositing the lower electrode 20 and the upper electrode 40 by sputtering using a gas with a large mass, or a method of dispersing an oxide of Y, La, or the like into the electrode made of a noble metal may be employed.

The ferroelectric film 30 is a PZTN complex oxide which includes Pb, Zr, Ti, and Nb. The ferroelectric film 30 may be formed by applying a sol-gel solution including Pb, Zr, Ti, and Nb to the lower electrode 20 using a spin coating method or the like. As the sol-gel solution, a sol-gel solution prepared by mixing a first sol-gel solution in which a polycondensation product for forming a $PbZrO_3$ perovskite crystal formed by Pb and Zr is dissolved in a solvent such as n-butanol in an anhydrous state, a second sol-gel solution in which a polycondensation product for forming a $PbTiO_3$ perovskite crystal formed by Pb and Ti among the constituent metal elements of the PZTN ferroelectric phase is dissolved in a solvent such as n-butanol in an anhydrous state, and a third sol-gel solution in which a polycondensation product for forming a $PbNbO_3$ perovskite crystal formed by Pb and Nb among the constituent metal elements of the PZTN ferroelectric phase is dissolved in a solvent such as n-butanol in an anhydrous state may be used. When forming the ferroelectric film 30, a sol-gel solution including a silicate or a germanate may be added to the above mixed sol-gel solution in order to reduce the crystallization temperature of the PZTN complex oxide. In more detail, a fourth sol-gel solution in which a polycondensation product for forming a $PbSiO_3$ crystal is dissolved in a solvent such as n-butanol in an anhydrous state may be added to the mixed sol-gel solution in an amount of 1 mol % or more but less than 5 mol %. The PZTN complex oxide, of which the crystallization temperature is increased due to the presence of Nb, can be crystallized in a temperature range of 700° C. or less which allows device formation by mixing the fourth sol-gel solution.

Figure 9A:
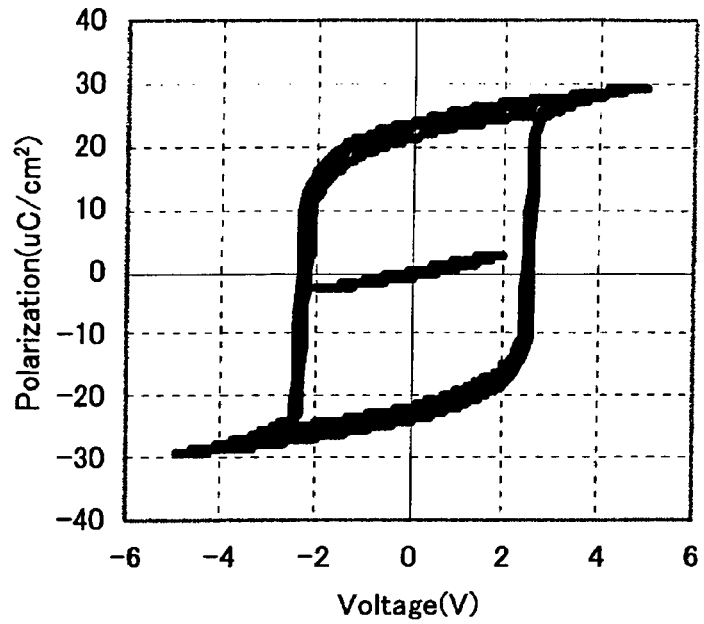
FIG. 9A is a graph showing hysteresis characteristics of a ferroelectric film including lead zirconate titanate (PZT) to which Ta is added.
Figure 9B:
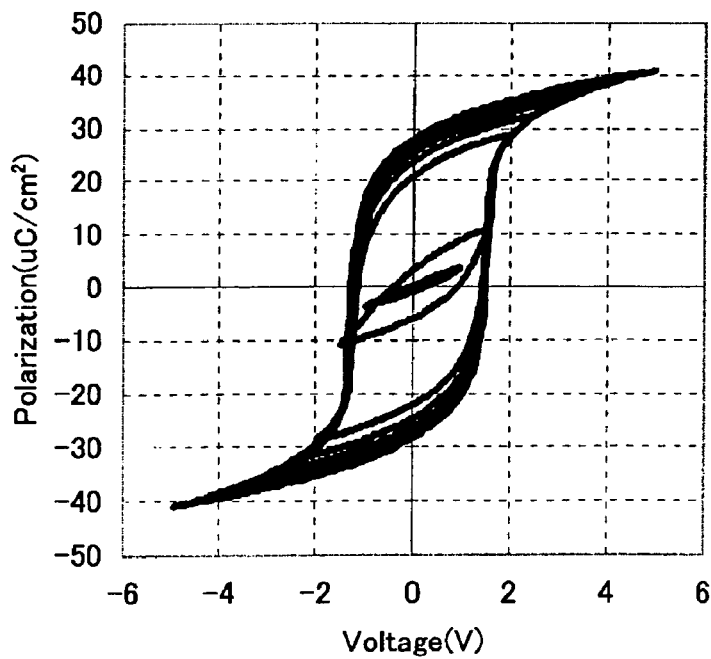
FIG. 9B is a graph showing hysteresis characteristics of a ferroelectric film including PZT to which W is added.

In this embodiment, the ferroelectric film 30 exhibits the same effect as described above in the case of adding Ta, W, V, or Mo to lead zirconate titanate (PZT) as an additive substance instead of Nb. The effect similar to that of Nb can be obtained by using Mn as an additive substance. From the same viewpoint, Pb may be replaced by an element with a valence of +3 or more in order to prevent Pb from being released. As examples of such elements, lanthanoid series elements such as La, Ce, Pr, Nd, Pm, Sm, Eu, Gd, Th, Dy, Ho, Er, Tm, Yb, and Lu can be given. As an additive for promoting crystallization, a germanate may be used instead of a silicate. FIG. 9A shows hysteresis characteristics in the case where 10 mol % of Ta is used for PZT as an additive substance instead of Nb. FIG. 9B shows hysteresis characteristics in the case where 10 mol % of W is used for PZT as an additive substance instead of Nb. As shown in FIG. 9A, the same effect as that of Nb addition is obtained in the case of using Ta. As shown in FIG. 9B, the same effect as that of Nb addition is obtained in the case of using W, since hysteresis characteristics with excellent insulating properties are obtained.

It is preferable that the applied ferroelectric film 30 be subjected to a pre-heat treatment in an oxidizing atmosphere at a temperature at which the PZTN complex oxide is not crystallized (400° C. or less, for example) so that the PZTN complex oxide is caused to be in an amorphous state. This enables the ferroelectric film 30 to be in a state in which a grain boundary does not exist since the ferroelectric film 30 is in an amorphous state, whereby steps described later can be performed while preventing diffusion of the elements. The pre-heat treatment in an oxidizing atmosphere also serves to introduce an oxygen component necessary for crystallizing the PZTN complex oxide after forming a protective film, as described later, into the ferroelectric film 30.

(2) As shown in FIG. 1B, the lower electrode 20, the ferroelectric film 30, and the upper electrode 40 are etched into a desired shape. A protective film 50 is formed of a silicon oxide ($SiO_2$) film so as to cover the lower electrode 20, the ferroelectric film 30, and the upper electrode 40. The protective film 50 may be formed by using a CVD method using trimethylsilane (TMS). TMS generates a smaller amount of hydrogen during the CVD process than tetraethylorthosilicate (TEOS) which is generally used to form a silicon oxide film. Therefore, process damage to the ferroelectric film 30 due to a reduction reaction can be reduced by using TMS. Moreover, the formation process of the protective film 50 using TMS can be performed at a temperature (room temperature to 350° C.) lower than that of the formation process using TEOS (formation temperature: 400° C. or more). Therefore, in the case where the ferroelectric film 30 is caused to be in an amorphous state in the step described in (1), the PZTN complex oxide can be prevented from being crystallized due to heat generated in the formation step of the protective film 50 or the like, whereby the ferroelectric film 30 can be maintained in an amorphous state.

(3) As shown in FIG. 1C, a heat treatment for crystallizing the PZTN complex oxide which makes up the ferroelectric film 30 is performed to obtain a ferroelectric capacitor including a PZTN ferroelectric crystal film 35. In this heat treatment, the PZTN complex oxide may be crystallized by a heat treatment in a non-oxidizing gas atmosphere such as Ar or $N_2$ or in air instead of the heat treatment in an oxidizing atmosphere.

Figure 2A:
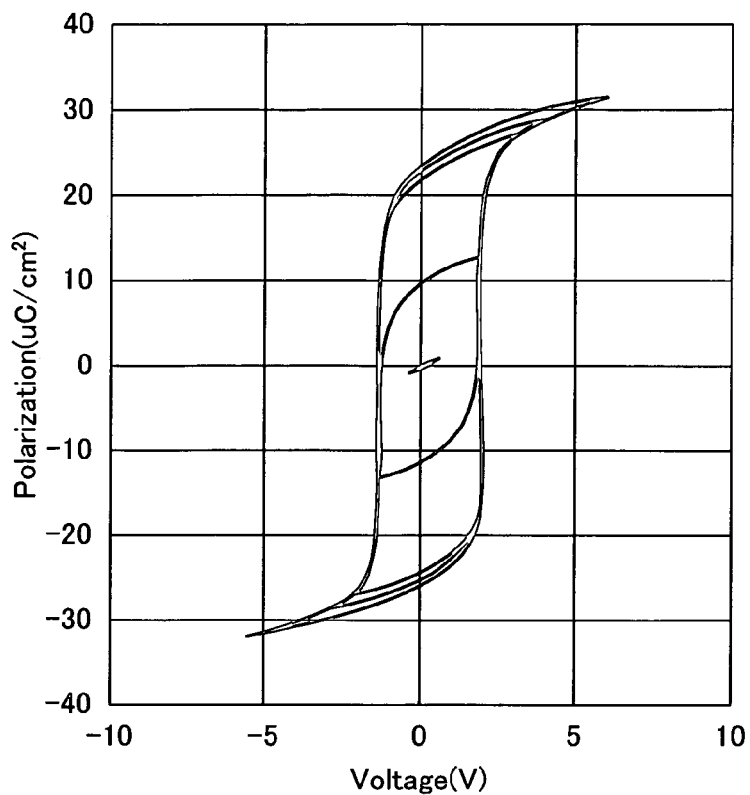
FIGS. 2A and 2B are graphs showing hysteresis characteristics of the ferroelectric capacitor to which an embodiment of the present invention is applied.
Figure 2B:
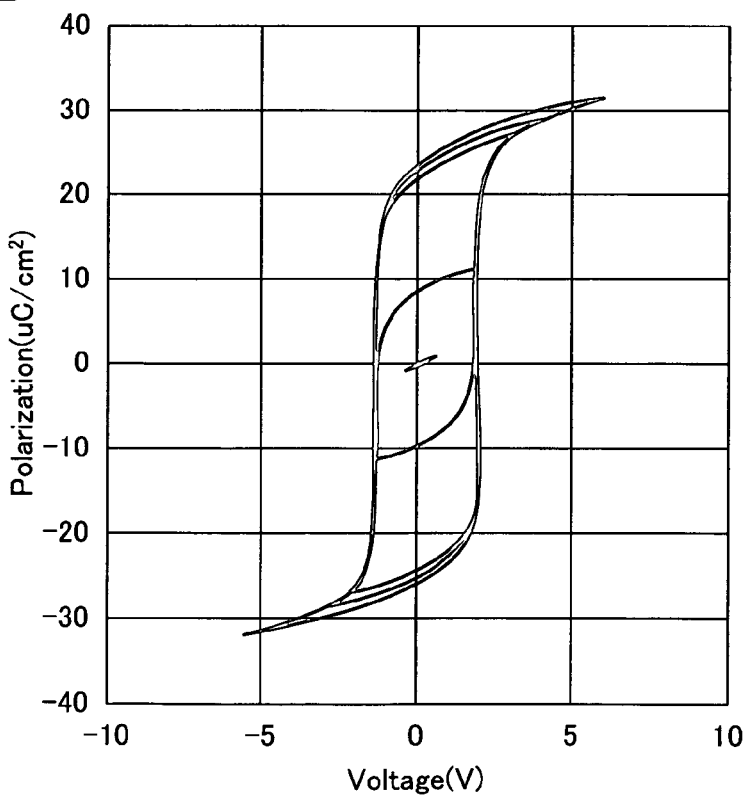

An $SiO_2$ protective film was formed using TMS on a ferroelectric capacitor including a Pt lower electrode, a PZTN ferroelectric film, and a Pt upper electrode by applying the manufacturing method of this embodiment. The PZTN ferroelectric was crystallized by performing a heat treatment in an oxygen atmosphere or in air after forming the $SiO_2$ protective film. FIGS. 2A and 2B show measurement results for hysteresis characteristics of the capacitor. FIG. 2A shows the case where the heat treatment was performed in an oxygen atmosphere. FIG. 2B shows the case where the heat treatment was performed in air. As shown in FIGS. 2A and 2B, hysteresis characteristics with excellent squareness were obtained in the case where the heat treatment was performed in an oxygen atmosphere and in air, even though a hydrogen resistant barrier film was not formed. This is because oxygen necessary for crystallization is introduced into the film in advance, since the ferroelectric film 30 is subjected to the pre-heat treatment in an oxidizing atmosphere during the formation of the ferroelectric film 30. Specifically, in the manufacturing method of this embodiment, the ferroelectric can be crystallized independent of the atmosphere during the heat treatment. In the case where the heat treatment for crystallization is performed in a non-oxidizing gas atmosphere, oxidation damage due to the high-temperature heat treatment can be prevented from being applied to peripheral members other than the capacitor (metal interconnects, for example) when applying the manufacturing method of this embodiment to a method of manufacturing a ferroelectric memory as described later. Since the heat treatment for crystallizing the PZTN complex oxide in the above step depends on the type of gas in the atmosphere to only a small extent, the heat treatment may be performed after forming a contact hole for forming a metal interconnect for connecting the upper electrode 40 with the outside in the protective film 50.

Figure 3:
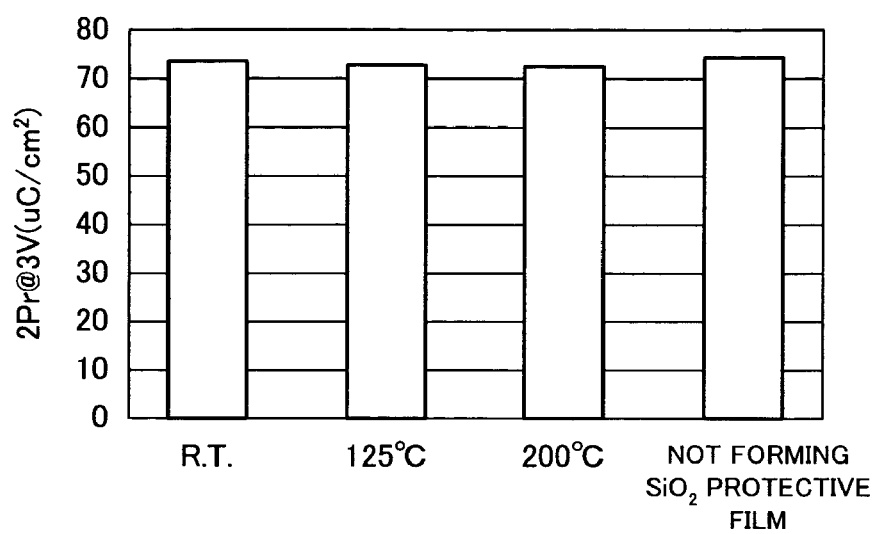
FIG. 3 is a graph showing electrical characteristics of the ferroelectric capacitor to which an embodiment of the present invention is applied.

An $SiO_2$ protective film was formed using TMS on a ferroelectric capacitor including a Pt lower electrode, a PZTN ferroelectric film, and a Pt upper electrode by applying the manufacturing method of this embodiment, and the PZTN ferroelectric was crystallized after forming the $SiO_2$ protective film. Hysteresis characteristics were measured for the case where the formation temperature of the $SiO_2$ protective film was changed to room temperature, 125° C., and 200° C. As a comparative example, hysteresis characteristics were measured for the case where the PZTN ferroelectric film was crystallized without forming the $SiO_2$ protective film. FIG. 3 shows measurement results for the change in the remnant polarization 2Pr. As shown in FIG. 3, no change in the remanent polarization 2Pr was observed for the case where the $SiO_2$ protective film was formed at room temperature, 125° C., or 200° C., and a value equal to that in the case of not forming the $SiO_2$ protective film was obtained. Specifically, in the manufacturing method of this embodiment, even if the ferroelectric film 30 is damaged due to hydrogen generated during the formation process of the protective film 50, the PZTN complex oxide is crystallized while recovering from such a damage by performing the heat treatment for crystallizing the PZTN complex oxide after forming the protective film 50. Therefore, the formation process of a barrier film for protecting the ferroelectric film 30 from a reduction reaction, which is necessary in a conventional method, can be omitted, whereby an increase in productivity and a reduction of manufacturing cost can be achieved.

A case where the manufacturing method of this embodiment is applied to a method of manufacturing a ferroelectric memory is described below.

2. Ferroelectric Memory

Figure 4A:
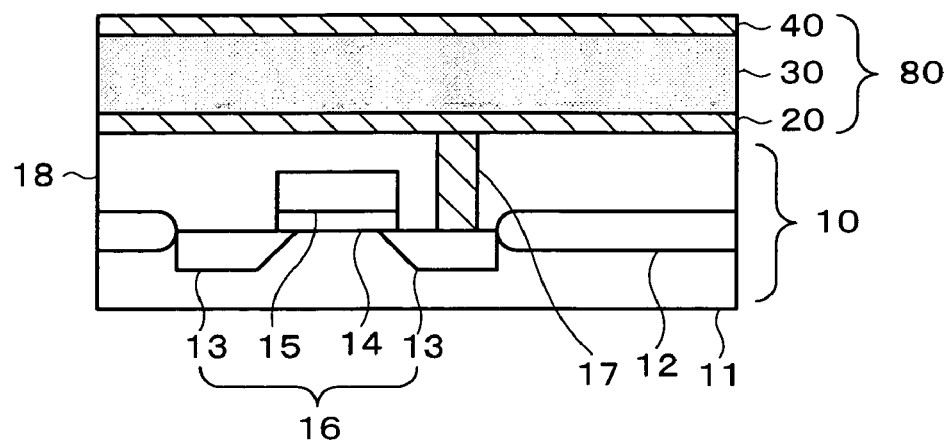
FIGS. 4A to 4C are cross-sectional views showing manufacturing steps of a ferroelectric memory according to an embodiment of the present invention.
Figure 4B:
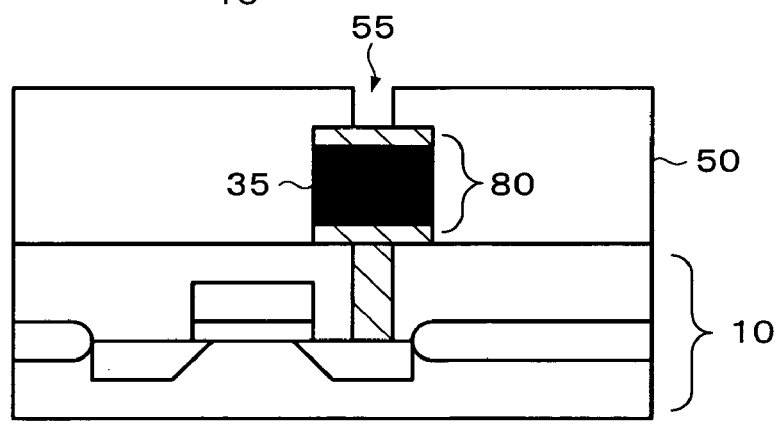
Figure 4C:
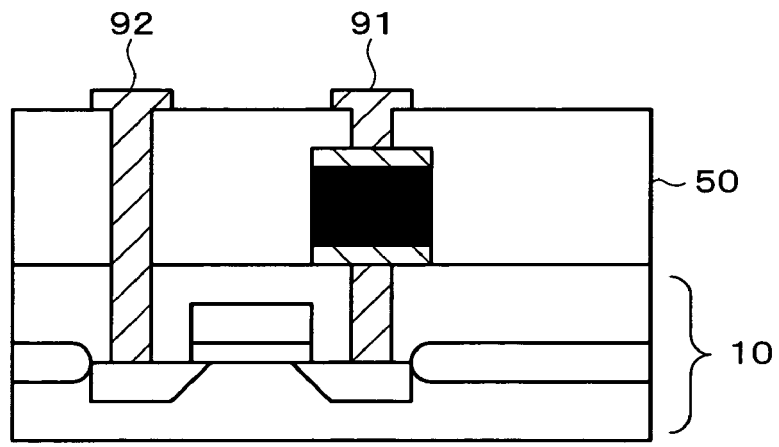

FIGS. 4A to 4C are cross-sectional views schematically showing manufacturing steps of a ferroelectric memory according to an embodiment of the present invention.

In this example, as shown in FIG. 4A, the lower electrode 20, the PZTN ferroelectric film 30, and the upper electrode 40 of a ferroelectric capacitor 80 are formed on the substrate 10 in that order. The PZTN ferroelectric film 30 is caused to be in an amorphous state by performing a pre-heat treatment in an oxidizing atmosphere. As the substrate 10, a semiconductor substrate 11 on which a cell select transistor 16 is formed may be used, as shown in FIG. 4A. The transistor 16 may include source/drains 13, a gate oxide film 14, and a gate electrode 15. A stacked structure may be employed in which a plug electrode 17 is formed of tungsten or the like on one of the source/drains 13 of the transistor 16 so as to be connected with the lower electrode 20 of the ferroelectric capacitor 80. In the substrate 10, the transistors 16 are separated by an element isolation region 12 in cell units. An interlayer dielectric 18 may be formed of an oxide film or the like on the transistor 16.

In the manufacturing steps according to this embodiment, the ferroelectric capacitor 80 is patterned into a desired size and shape, as shown in FIG. 4B. The $SiO_2$ protective film 50 is formed using trimethylsilane (TMS) so as to cover the ferroelectric capacitor 80. After forming a contact hole 55 for external connection in the protective film 50, the PZTN ferroelectric is crystallized by performing a heat treatment to form the PZTN ferroelectric film 35. When crystallizing the PZTN ferroelectric, the heat treatment for crystallization may be performed in a non-oxidizing atmosphere. This prevents oxidation damage due to the high-temperature heat treatment from being applied to peripheral members other than the ferroelectric capacitor 80 (metal interconnects, for example).

As shown in FIG. 4C, a contact hole for connecting the transistor 16 with the outside is formed in the $SiO_2$ protective film 50, and metal interconnect layers 91 and 92 are formed in the contact holes to obtain a ferroelectric memory.

According to the manufacturing steps according to this embodiment, the formation process of a barrier film for protecting the ferroelectric film 30 from a reduction reaction, which is necessary in a conventional method, can be omitted, whereby an increase in productivity and a reduction of manufacturing cost can be achieved. Moreover, since the ferroelectric capacitor 80 having hysteresis characteristics with excellent squareness can be formed even if the formation process of a barrier film is omitted, a ferroelectric memory having excellent characteristics can be obtained.

The above description illustrates the manufacturing steps of a so-called 1T1C type ferroelectric memory. The method of manufacturing a ferroelectric capacitor of this embodiment may also be applied to manufacturing steps of ferroelectric memories using various cell structures such as 2T2C type and simple matrix type (cross-point type).

3. Piezoelectric Device and Ink-Jet Recording Head

An ink-jet recording head according to an embodiment of the present invention is described below in detail.

As an ink-jet recording head in which a part of a pressure generating chamber connected with a nozzle orifice which ejects an ink droplet is formed by using a diaphragm, and the ink droplet is ejected from the nozzle orifice by pressurizing the ink in the pressure generating chamber by deforming the diaphragm using a piezoelectric device, an ink-jet recording head using a longitudinal vibration mode piezoelectric actuator which expands and contracts in the axial direction of the piezoelectric device, and an ink-jet recording head using a flexural vibration mode piezoelectric actuator have been put into practical use.

As an ink-jet recording head using the flexural vibration mode actuator, an ink-jet recording head obtained by forming a uniform piezoelectric layer over the entire surface of the diaphragm by using a deposition technology, and cutting the piezoelectric layer into a shape corresponding to the pressure generating chamber by using a lithographic method so that the piezoelectric device is independently formed in units of the pressure generating chambers has been known.

Figure 5:
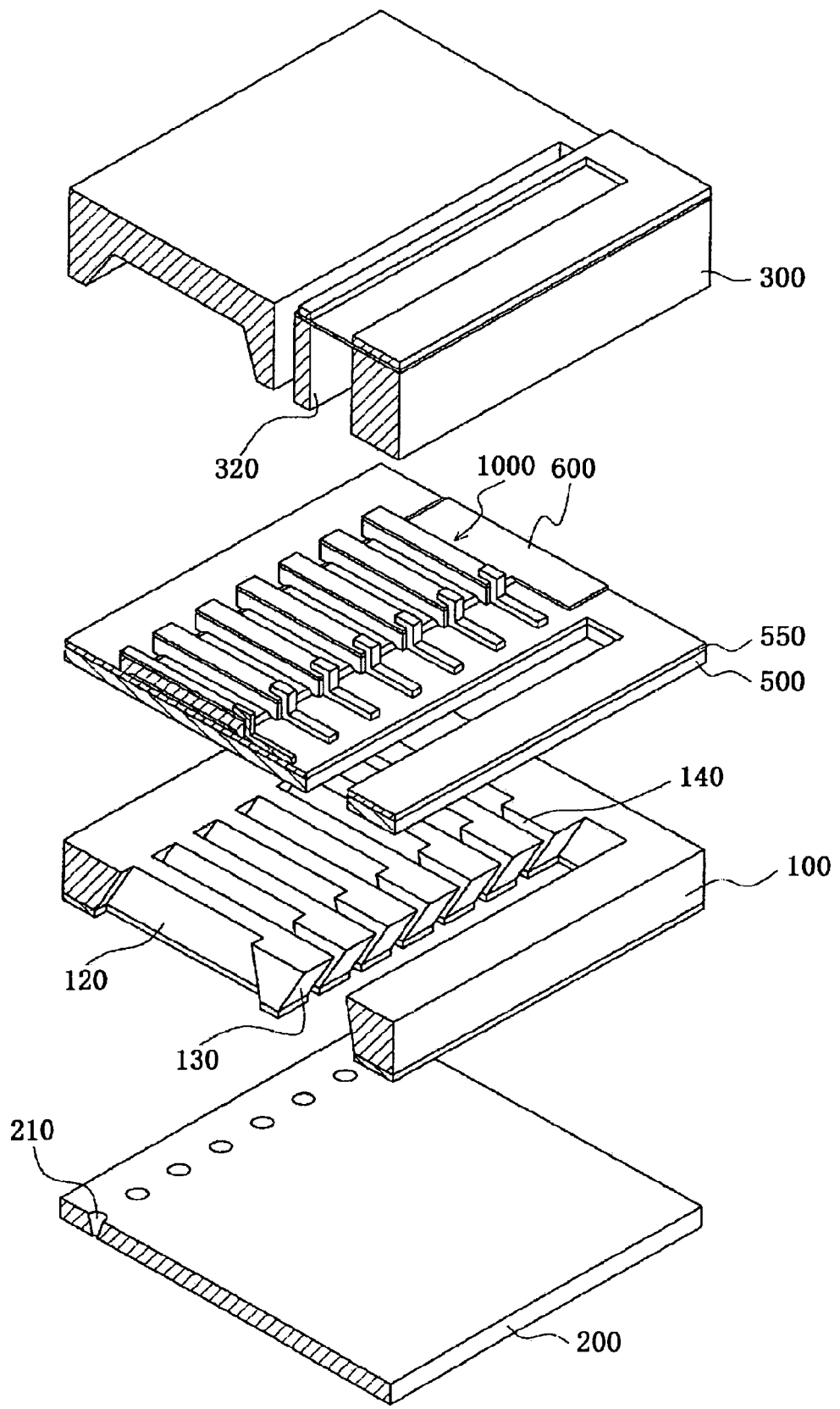
FIG. 5 is an exploded perspective view of a recording head according to an embodiment of the present invention.
Figure 6A:
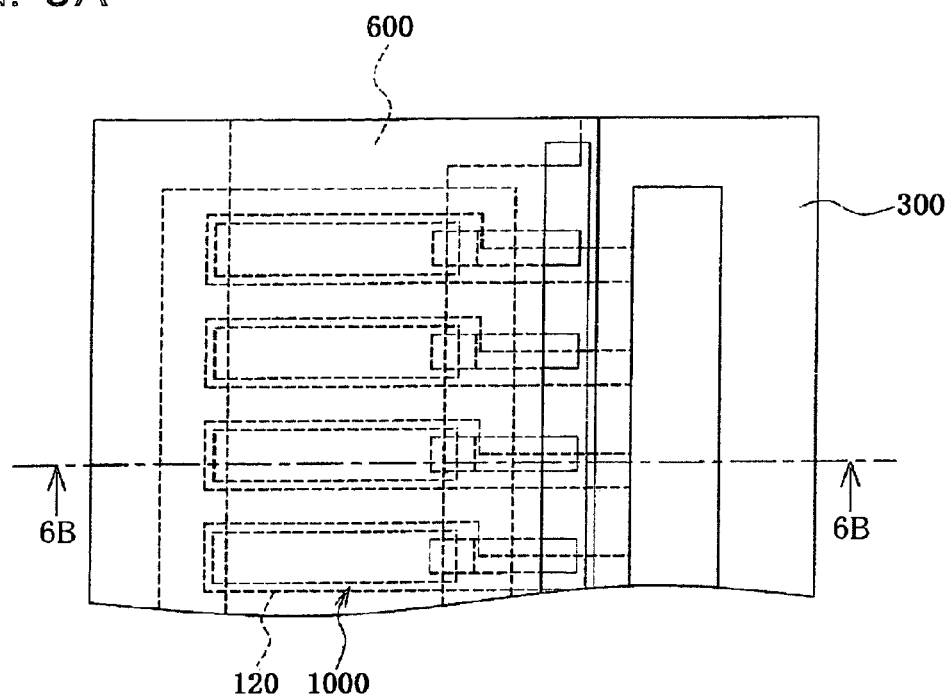
FIG. 6A is a plan view of the recording head shown in FIG. 5.
Figure 6B:
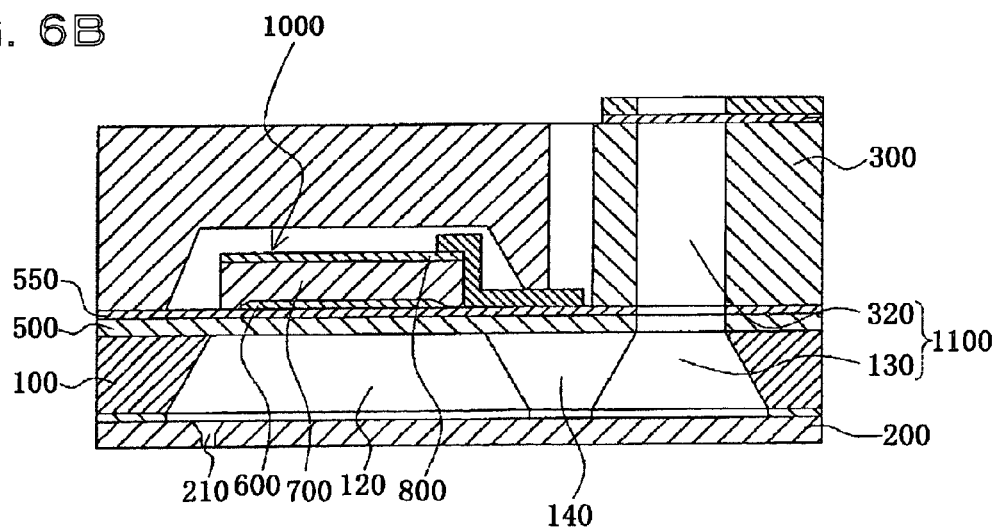
FIG. 6B is a cross-sectional view of the recording head shown in FIG. 5.
Figure 7:
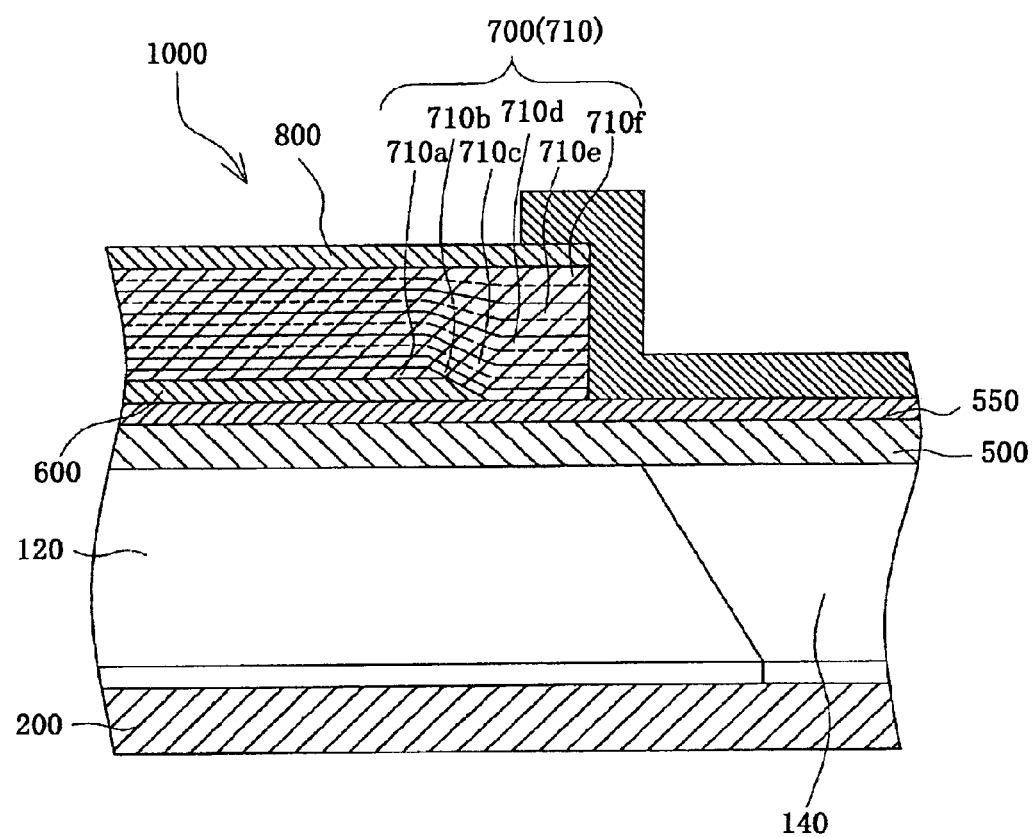
FIG. 7 is a schematic diagram showing a structure of a piezoelectric device according to an embodiment of the present invention.

FIG. 5 is an exploded perspective view showing an ink-jet recording head according to an embodiment of the present invention. FIGS. 6A and 6B are respectively a plan view and a cross-sectional view of the recording head shown in FIG. 5. FIG. 7 is a schematic diagram showing a structure of a piezoelectric device 1000. As shown in the drawings, a channel forming substrate 100 is a (110)-oriented silicon single crystal substrate, and an elastic film 500 with a thickness of 1 to 2 µm, which is made of silicon dioxide formed in advance by using thermal oxidation, is formed on one side of the channel forming substrate 10. A plurality of pressure generating chambers 120 are disposed in the channel forming substrate 100 in parallel in the widthwise direction. A communication section 130 is formed in the channel forming substrate 100 in the region outside the pressure generating chamber 120 in the longitudinal direction of the pressure generating chamber 120. The communication section 130 is connected with the pressure generating chambers 120 through ink supply paths 140 provided in units of the pressure generating chambers 120. The communication section 130 is connected with a reservoir section 320 of a sealing substrate 300 described later to make up a part of a reservoir 1100 as a common ink chamber for the pressure generating chambers 120. The ink supply path 140 is formed to have a width smaller than the width of the pressure generating chamber 120, and maintains channel resistance of the ink, which flows into the pressure generating chamber 120 from the communication section 130, constant.

A nozzle plate 200, in which nozzle orifices 210 connected with the pressure generating chambers 120 near the edge opposite to the ink supply path 140 are formed, is secured to the channel forming substrate 100 on the opening side through an adhesive, a thermal-deposited film, or the like.

The elastic film 500 with a thickness of about 1.0 µm is formed on the channel forming substrate 100 on the side opposite to the opening side as described above. An insulator film 550 with a thickness of about 0.4 µm is formed on the elastic film 500. A lower electrode film 600 with a thickness of about 0.2 µm, a piezoelectric layer 700 with a thickness of about 1.0 µm, and an upper electrode film 800 with a thickness of about 0.05 µm are stacked on the insulator film 550 using a process described later to make up the piezoelectric device 1000. The piezoelectric device 1000 is the section including the lower electrode film 600, the piezoelectric layer 700, and the upper electrode film 800. Generally, one of the electrodes of the piezoelectric device 1000 is used as a common electrode, and the other electrode and the piezoelectric layer 700 are patterned in units of the pressure generating chambers 120. A section which is formed by the patterned electrode and piezoelectric layer 700 and in which a piezoelectric strain occurs by applying a voltage between the electrodes is called a piezoelectric active section. In this embodiment, the lower electrode film 600 is used as the common electrode for the piezoelectric devices 1000, and the upper electrode film 800 is used as the individual electrodes for the piezoelectric devices 1000. However, the electrode configuration may be the reverse of the above electrode configuration depending on a driver circuit or interconnects. In either case, the piezoelectric active sections are formed in units of the pressure generating chambers. The piezoelectric device 1000 and the diaphragm which is displaced due to drive of the piezoelectric device 1000 are collectively called a piezoelectric actuator. The piezoelectric layers 70 are independently provided in units of the pressure generating chambers 12. As shown in FIG. 7, the piezoelectric layer 700 is made up of a plurality of ferroelectric film layers 710 (710a to 710f).

Figure 8:
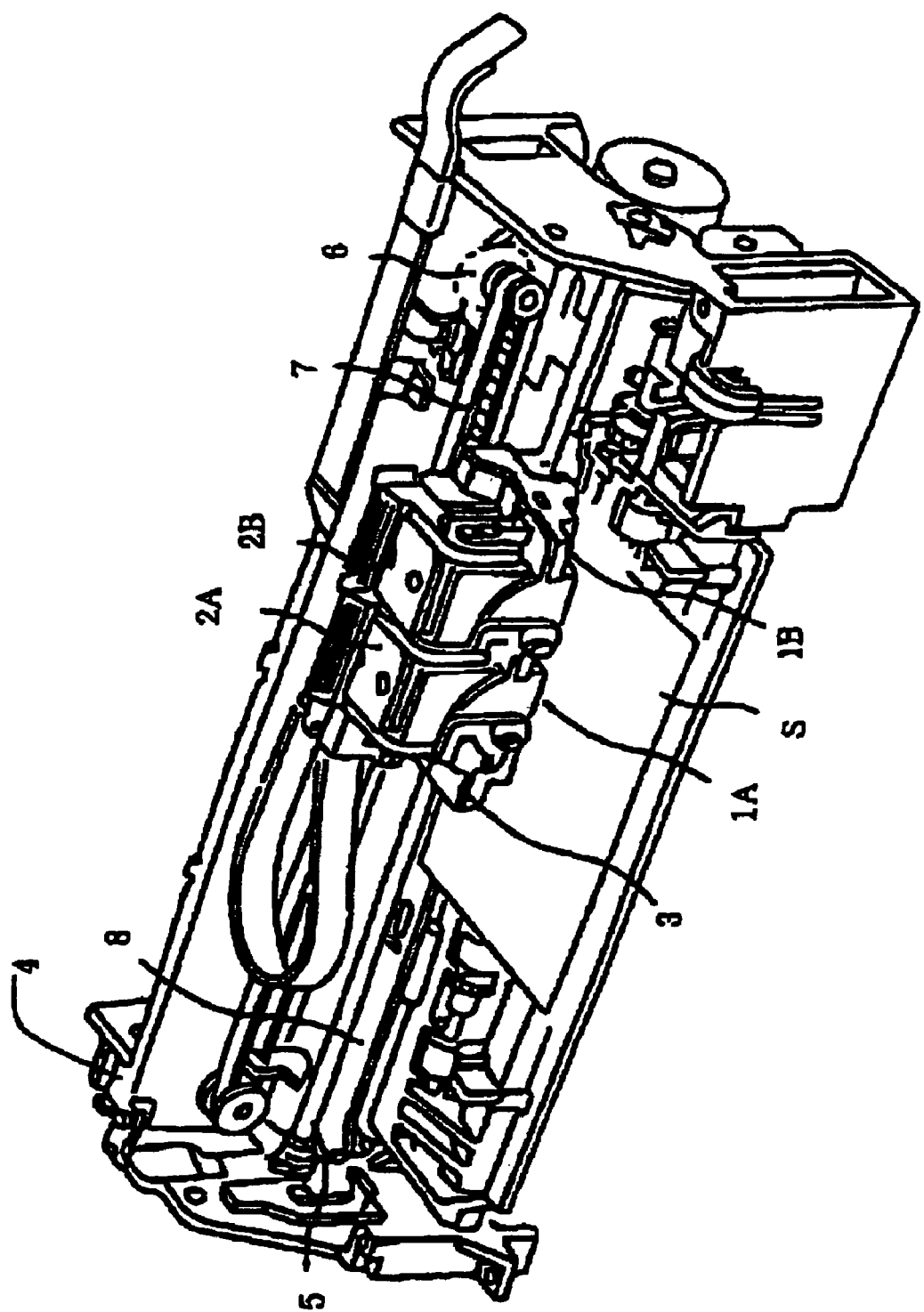
FIG. 8 is a schematic view showing an example of an ink-jet recording device according to an embodiment of the present invention.

The ink-jet recording head makes up a part of a recording head unit including an ink channel which is connected with an ink cartridge or the like, and is provided in an ink-jet recording device. FIG. 8 is a schematic view showing an example of the ink-jet recording device. As shown in FIG. 8, cartridges 2A and 2B which make up ink supply means are removably provided to recording head units 1A and 1B, each including the ink-jet recording head. A carriage 3 provided with the recording head units 1A and 1B is provided to a carriage shaft 5 attached to a device body 4 so as to be able to move freely in the axial direction. The recording head units 1A and 1B respectively eject a black ink composition and a color ink composition, for example. The driving force of a drive motor 6 is transferred to the carriage 3 through a plurality of gear wheels (not shown) and a timing belt 7, whereby the carriage 3 carrying the recording head units 1A and 1B is moved along the carriage shaft 5. A platen 8 is provided in the device body 4 along the carriage shaft 5. A recording sheet S as a recording medium such as paper fed by using a paper feed roller (not shown) or the like is transferred onto the platen 8.

The above description illustrates the ink-jet recording head which ejects the ink as a liquid jet head as an example. However, the present invention aims at a liquid jet head using a piezoelectric device and a liquid jet device in general. As the liquid jet head, a recording head used for an image recording device such as a printer, a color material jet head used for manufacturing a color filter for a liquid crystal display or the like, an electrode material jet head used for forming an electrode of an organic EL display, a field emission display (FED), or the like, a bio-organic substance jet head used for manufacturing a bio-chip, and the like can be given.

Since the piezoelectric device according to this embodiment uses the PZTN film according to the above embodiment as the piezoelectric layer, the following effects are obtained.

(1) Since covalent bonding properties in the piezoelectric layer are improved, the piezoelectric constant can be increased.

(2) Since vacancies of PbO in the piezoelectric layer can be reduced, occurrence of a heterophase at the interface between the piezoelectric layer and the electrode is prevented, whereby an electric field is easily applied. Therefore, efficiency of the piezoelectric device can be increased.

(3) Since a leakage current from the piezoelectric layer is reduced, the thickness of the piezoelectric layer can be reduced.

Since the liquid jet head and the liquid jet device according to this embodiment use the piezoelectric device including the above piezoelectric layer, the following effect is obtained.

(4) Since deterioration of the piezoelectric layer due to fatigue can be reduced, the change in the amount of displacement of the piezoelectric layer over time can be reduced, whereby the reliability can be improved.

The preferred embodiments of the present invention are described above. However, the present invention is not limited to the above-described embodiments. The present invention may be embodied in various modified forms within the scope of the present invention.

What is claimed is:

1. A method of manufacturing a ferroelectric capacitor, comprising:
    forming a lower electrode on a substrate;
    forming a ferroelectric film which includes a lead zirconate titanate niobate (PZTN) complex oxide including lead, zirconium, titanium, and niobium on the lower electrode;
    forming an upper electrode on the ferroelectric film;
    forming a silicon oxide film without providing a hydrogen barrier film so as to cover the lower electrode, the ferroelectric film, and the upper electrode; and
    performing heat treatment for crystallizing the PZTN complex oxide at least after forming the silicon oxide film.

2. The method of manufacturing a ferroelectric capacitor as defined in claim 1,
    the PZTN complex oxide being in an amorphous state after pre-heat treatment in an oxidizing atmosphere and before the heat treatment in the step of forming the ferroelectric film.

3. The method of manufacturing a ferroelectric capacitor as defined in claim 1,
    the silicon oxide film being formed by using trimethylsilane.

4. The method of manufacturing a ferroelectric capacitor as defined in claim 1,
    the heat treatment for crystallizing the PZTN complex oxide being performed in a non-oxidizing atmosphere.

* * * * *